(12) United States Patent
Jeong et al.

(10) Patent No.: US 11,201,535 B2
(45) Date of Patent: Dec. 14, 2021

(54) APPARATUS AND METHOD FOR CONTROLLING DRIVING OF SWITCHING DEVICE FOR POWER CONVERTER

(71) Applicants: HYUNDAI MOTOR COMPANY, Seoul (KR); KIA MOTORS CORPORATION, Seoul (KR)

(72) Inventors: Kang Ho Jeong, Changwon-si (KR); Ji Woong Jang, Hwaseong-si (KR); Sang Cheol Shin, Suwon-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 22 days.

(21) Appl. No.: 16/787,955

(22) Filed: Feb. 11, 2020

(65) Prior Publication Data
US 2020/0395837 A1   Dec. 17, 2020

(30) Foreign Application Priority Data
Jun. 17, 2019   (KR) .................. 10-2019-0071521

(51) Int. Cl.
*H02M 1/08*   (2006.01)
*H03K 17/567*   (2006.01)
*H02P 27/08*   (2006.01)
*H02M 7/5387*   (2007.01)

(52) U.S. Cl.
CPC ......... *H02M 1/08* (2013.01); *H02M 7/53871* (2013.01); *H02P 27/08* (2013.01); *H03K 17/567* (2013.01)

(58) Field of Classification Search
CPC .. H02M 1/08; H02M 7/53871; H02M 7/5387; H02M 7/53873; H02M 1/32; H02P 27/08; H03K 17/567; H03K 17/063; H03K 17/163; H03K 17/122
See application file for complete search history.

(56) References Cited

U.S. PATENT DOCUMENTS

| | | | |
|---|---|---|---|
| 9,929,647 B1* | 3/2018 | Jeong ................. | H03K 17/0828 |
| 2012/0176111 A1* | 7/2012 | Chen ...................... | H02M 1/08 323/284 |
| 2015/0123582 A1* | 5/2015 | Gu .......................... | H02P 6/182 318/400.35 |
| 2021/0021227 A1* | 1/2021 | Kimura ................... | H02M 1/08 |

* cited by examiner

*Primary Examiner* — Adolf D Berhane
(74) *Attorney, Agent, or Firm* — Morgan, Lewis & Bockius LLP

(57) ABSTRACT

An apparatus and a method for controlling a switching device for a power converter are provided. The apparatus includes a gate driver configured to apply a first driving voltage and a second driving voltage to the gate terminal based on one turn-on of the switching device, wherein the first driving voltage and the second driving voltage have different values; to turn on the switching device; and a controller configured to control the gate driver such that the gate driver applies the second driving voltage to the gate terminal after the first driving voltage is applied to the gate terminal.

12 Claims, 7 Drawing Sheets

APPARATUS AND METHOD FOR CONTROLLING DRIVING OF SWITCHING DEVICE FOR POWER CONVERTER

CROSS-REFERENCE TO RELATED APPLICATION

This application claims priority to and the benefit of Korean Patent Application No. 10-2019-0071521, filed on Jun. 17, 2019, the entire contents of which are incorporated herein by reference.

TECHNICAL FIELD

The present disclosure relates to an apparatus and method for controlling driving of a switching device for a power converter.

BACKGROUND

The statements in this section merely provide background information related to the present disclosure and may not constitute prior art.

Generally, in a vehicle employing an electric motor as a driving source, an inverter is provided to generate alternating current (AC) power to be supplied to the electric motor. The inverter includes a power module which controls the flow of current applied from a motor power supply, and the power module is made up of a switching device such as an insulated gate bipolar transistor (IGBT).

The switching device is driven by a voltage applied to a gate terminal thereof so that current may flow between a collector terminal and an emitter terminal of the switching device.

When the voltage applied to the gate terminal is lower in level, the amount of current saturated in the switching device is reduced owing to physical properties of the switching device even though a short-circuit is generated in the power module. As the amount of current Isc saturated in the switching device is reduced, saturated current energy Isc× time which is tolerable by the switching device for a predetermined period of time is reduced, so that the switching device may be prevented from being damaged. The saturated current energy refers to energy that acts on the inside of the switching device by current saturated between the collector terminal and emitter terminal of the switching device for a turn-on time of the switching device.

However, lowering the gate voltage hinders effective driving of the switching device. This results from the fact that, when current flows in the switching device, the lower gate voltage increases a voltage drop between the collector terminal and emitter terminal of the switching device, thereby causing a larger amount of conduction loss and, in turn, reducing efficiency of the inverter, resulting in a negative effect on fuel efficiency of the vehicle.

SUMMARY

The present disclosure provides an apparatus and method for controlling driving of a switching device for a power converter in which a driving voltage to a gate terminal of the switching device is supplied to the gate terminal while being dualized into two levels, so that the switching device may be prevented from being damaged due to current saturated between a collector terminal and an emitter terminal thereof when a short-circuit is generated in a power module.

In one aspect, the present disclosure provides an apparatus for controlling driving of a switching device for a power converter, the switching device being turned on by a voltage applied to a gate terminal thereof, the apparatus including a gate driver for applying a first driving voltage and a second driving voltage having different levels to the gate terminal on the basis of one turn-on of the switching device to turn on the switching device, and a controller for controlling an operation of the gate driver such that the gate driver applies the second driving voltage to the gate terminal after applying the first driving voltage to the gate terminal.

In some forms of the present disclosure, the apparatus may have the following features. In detail, the second driving voltage may be higher than the first driving voltage by a predetermined level or more. The second driving voltage may be input to the gate terminal of the switching device under the condition that the switching device is turned on by the first driving voltage.

In some forms of the present disclosure, the gate driver may include a first switch connected between a first gate power source and the gate terminal, the first switch applying the first driving voltage to the gate terminal when turned on, and a second switch connected between a second gate power source and the gate terminal, the second switch applying the second driving voltage to the gate terminal when turned on.

In some forms of the present disclosure, the controller may turn on the second switch at a predetermined delay time after turning on the first switch. In addition, when the switching device is turned on, a voltage applied between the gate terminal of the switching device and an emitter terminal thereof may be held at the first driving voltage for the delay time and then rise to the second driving voltage.

In another aspect, the present disclosure provides a method of controlling driving of a switching device for a power converter, the switching device being turned on by a voltage applied to a gate terminal thereof, the method including applying a first driving voltage to the gate terminal by a gate driver to turn on the switching device, and applying a second driving voltage having a level different from that of the first driving voltage to the gate terminal by the gate driver under the condition that the switching device is turned on, to change a voltage at the gate terminal to the second driving voltage.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
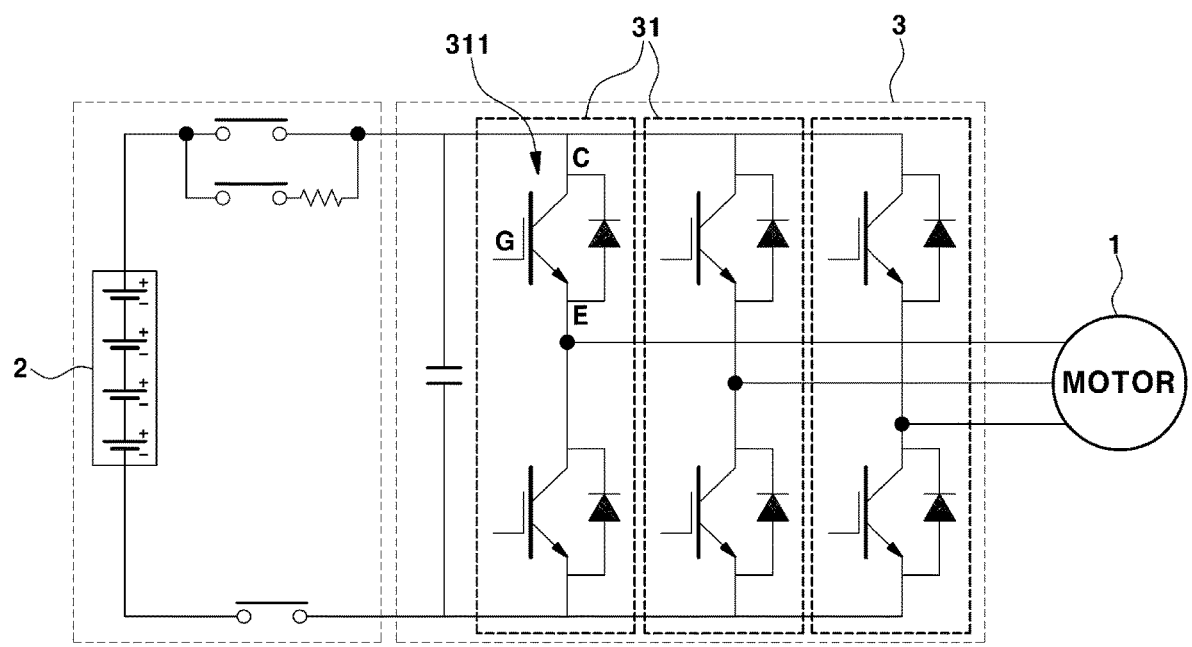
FIG. 1 is a view illustrating a motor power system of a vehicle.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

In a vehicle employing an electric motor as a driving source, an inverter may be provided as a power converter which generates alternating current (AC) power to be supplied to the electric motor.

Referring to FIG. 1, the inverter, denoted by reference numeral 3, includes power modules 31 of three phases for controlling the flow of direct current (DC) power applied from a power supply 2 for a motor 1 to generate AC power. Each power module 31 is made up of two switching devices 311 connected in series. Each switching device 311 may be an insulated gate bipolar transistor (IGBT), a field effect transistor (FET) or the like which may be turned on under the control of a gate-emitter voltage Vge.

Each switching device 311 has a gate terminal G to which a driving voltage is applied, and a collector terminal C and an emitter terminal E which, when the driving voltage is applied to the gate terminal G, become conductive so that current flows therebetween. In the switching device 311, conduction may be made between the collector terminal C and the emitter terminal E when the driving voltage is applied to the gate terminal G. In other words, in the switching device 311, when a predetermined driving voltage is applied to a gate-emitter circuit of the switching device 311, conductivity may be imparted to a collector-emitter section and current may thus flow therein. Namely, when the driving voltage is applied to the gate terminal G, the switching device 311 may be turned on and conduction may thus be made between the collector terminal C and the emitter terminal E.

Figure 2:
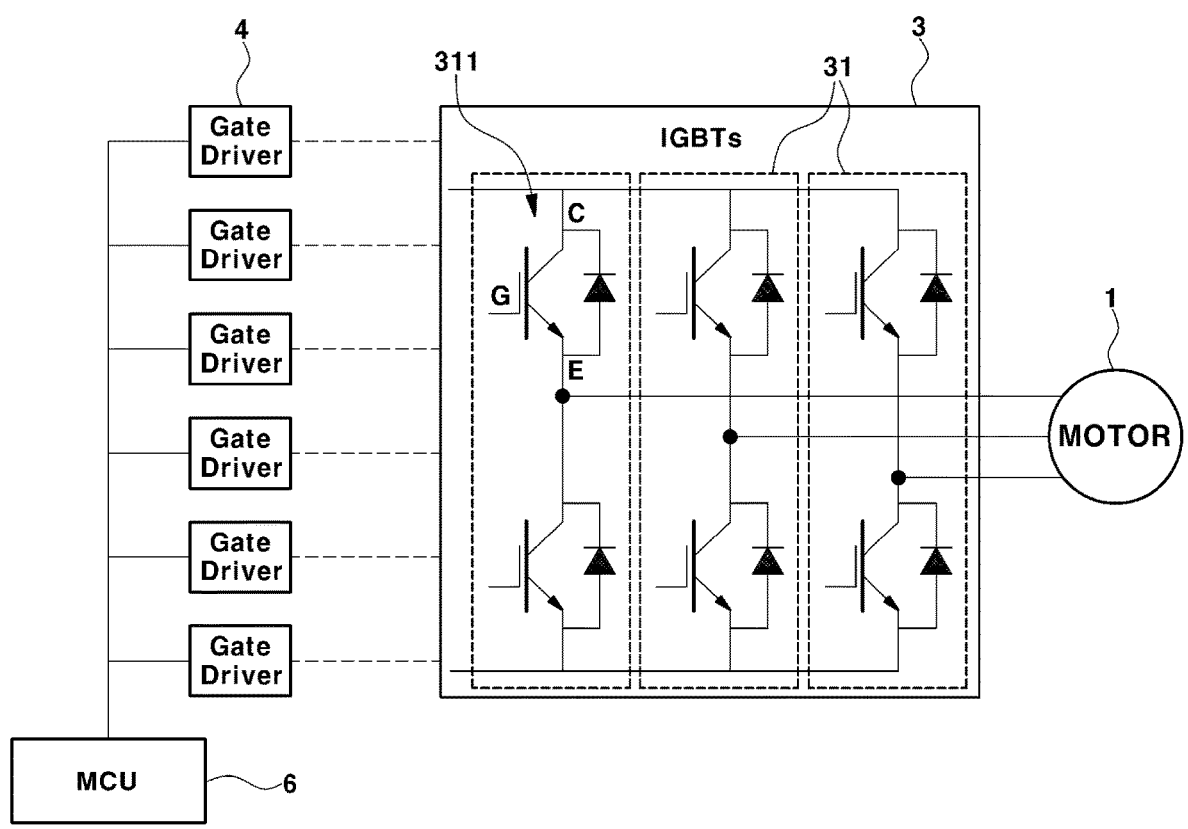
FIG. 2 is a view illustrating an inverter driving system.
Figure 3:
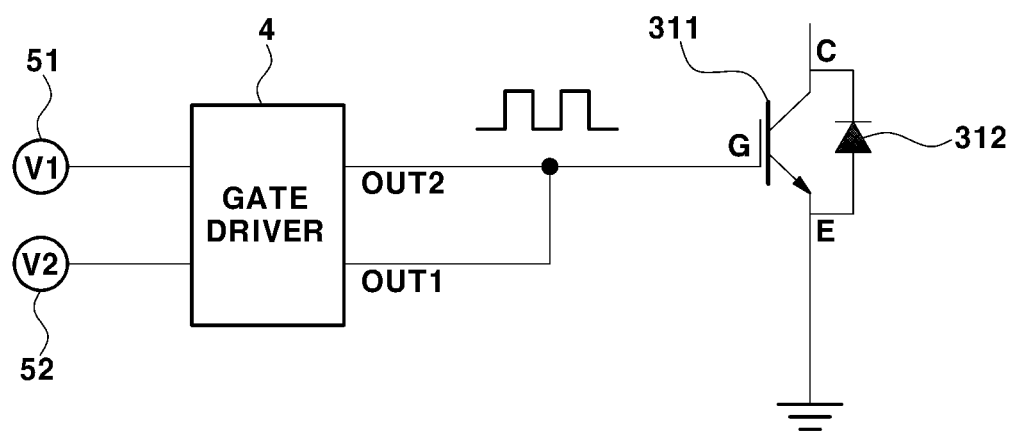
FIG. 3 is a view illustrating a switching device driving control apparatus in one form of the present disclosure.

Referring to FIGS. 2 and 3, the gate terminal G may receive the driving voltage through a gate driver 4, which may be controlled by a controller 6. The controller 6 may be a motor control unit (MCU) of the vehicle which controls the motor. In addition, the gate terminal G may be connected to the gate power supplys 51,52, which supplies the driving voltage through the gate driver 4.

In addition, in a motor power system as in FIG. 1, the collector terminal C may be connected to a positive terminal of the power supply 2, and the emitter terminal E may be connected to a negative terminal of the power supply 2.

For reference, in FIG. 3, a diode 312, which is connected in parallel to the collector terminal C and emitter terminal E of the switching device 311, may be a freewheeling diode having a short switch-off time. The freewheeling diode 312 may be selectively connected to the switching device 311 to enhance reverse cut-off performance of the switching device 311.

When the voltage applied to the gate terminal G is lower in level, the amount of current saturated in the switching device 311 is reduced owing to physical properties of the switching device 311 even though a short-circuit is generated in the power module 31. As the amount of current Isc saturated in the switching device 311 is reduced, saturated current energy Isc×time which is tolerable by the switching device 311 for a predetermined period of time is reduced, so that the switching device 311 may be prevented from being damaged.

However, lowering the gate-emitter voltage Vge of the switching device 311 hinders effective driving of the switching device 311. This results from the fact that, when current flows in the switching device 311, as the gate-emitter voltage Vge is lower, a voltage drop Vce generated between the collector terminal C and emitter terminal E of the switching device 311 increases, thereby causing a larger amount of conduction loss of the switching device 311 and, in turn, reducing efficiency of the inverter 3, resulting in a negative effect on fuel efficiency of the vehicle.

Therefore, some forms of the present disclosure provide a driving control apparatus for the switching device 311 which controls driving of the switching device 311 by dualizing the driving voltage to the gate terminal G of the switching device 311 into two levels. This driving control apparatus may apply the driving voltage for turning-on of the switching device 311 to the gate terminal at two levels, so as to prevent the switching device 311 from being damaged due to current saturated between the collector terminal C and emitter terminal E thereof when a short-circuit is generated in the power module 31.

As shown in FIG. 3, the driving control apparatus includes the gate driver 4 which applies the driving voltage to the gate terminal G of the switching device 311, and the controller 6 which controls the operation of the gate driver 4.

The gate driver 4 may be disposed between the gate power supply 51,52 and the gate terminal G of the switching device 311. The gate driver 4 may selectively apply the driving voltage output from the gate power supply 51,52 to the gate terminal G to turn on the switching device 311. Namely, the gate driver 4 may be configured to apply the driving voltage to the gate terminal G by a pulse width modulation (PWM) manner. The driving voltage may be controlled to be output and applied to the gate terminal G in the form of a square-wave signal.

The gate driver 4 may dualize the driving voltage into two levels and sequentially input the resulting voltages of the two levels to the gate terminal G. That is, the gate driver 4 may apply a first driving voltage and a second driving voltage having different levels to the gate terminal G.

Figure 4:
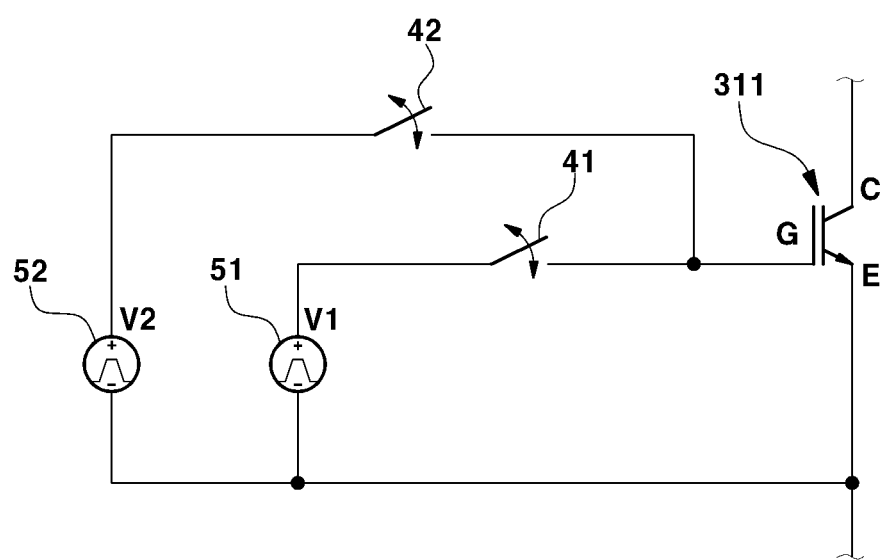
FIG. 4 is a detailed diagram of the switching device driving control apparatus in one form of the present disclosure.

As shown in FIG. 4, in order to output the driving voltage to the gate terminal G at two levels, the gate driver 4 may include a first switch 41 and a second switch 42 which are on/off-controlled by the controller 6.

The first switch 41 may be connected between a first gate power source 51 and the gate terminal G to apply the first driving voltage to the gate terminal G. The second switch 42 may be connected between a second gate power source 52 and the gate terminal G to apply the second driving voltage to the gate terminal G.

The first gate power source 51 may be configured to output the first driving voltage, and the first switch 41 may input the first driving voltage to the gate terminal G when turned on by the controller 6. The first switch 41 may be an electronic switch of a normal open type which is closed when changed to an on state by the controller 6. When the first switch 41 is turned on to be closed, conduction may be made between the first gate power source 51 and the gate terminal G so that current may flow therebetween.

The second gate power source 52 may be configured to output the second driving voltage, and the second switch 42 may input the second driving voltage to the gate terminal G when turned on by the controller 6. The second switch 42 may be an electronic switch of a normal open type which is closed when changed to an on state by the controller 6. When the second switch 42 is turned on to be closed, conduction may be made between the second gate power source 52 and the gate terminal G.

The first driving voltage has a level different from that of the second driving voltage. That is, the first driving voltage may be lower than the second driving voltage by a predetermined reference voltage or more. In other words, the second driving voltage may be higher than the first driving voltage by the reference voltage or more. The second driving voltage is set to a level capable of normally turning on the switching device 311, and the first driving voltage is set to a level which is lower than that of the second driving voltage, but is capable of normally turning on the switching device 311. In addition, the second driving voltage is set to a level capable of normally holding a turn-on state of the switching device 311, and the first driving voltage is set to a level which is capable of reducing the amount of current saturated in the switching device 311, but causes no increase in switching loss and conduction loss of the switching device 311. For example, the first driving voltage may be 12V, and the second driving voltage may be 15V. In this case, the reference voltage may be 3V.

The controller 6 controls the switching operation of the gate driver 4 such that the first driving voltage is applied to the gate terminal G and, thereafter, the second driving voltage is applied to the gate terminal G. To this end, when driving the first switch 41 and the second switch 42, the controller 6 first turns on the first switch 41 and then turns on the second switch 42 after the lapse of a predetermined delay time. That is, the controller 6 drives the first switch 41 at a turn-on time of the switching device 311 and then drives the second switch 42 after the lapse of the delay time from the turn-on time. In other words, the controller 6 drives the second switch 42 after delay of a certain time from the turn-on time of the switching device 311. The delay time may be set to a short time in which there is no increase in conduction loss of the switching device 311 turned on by the first driving voltage.

Figure 5:
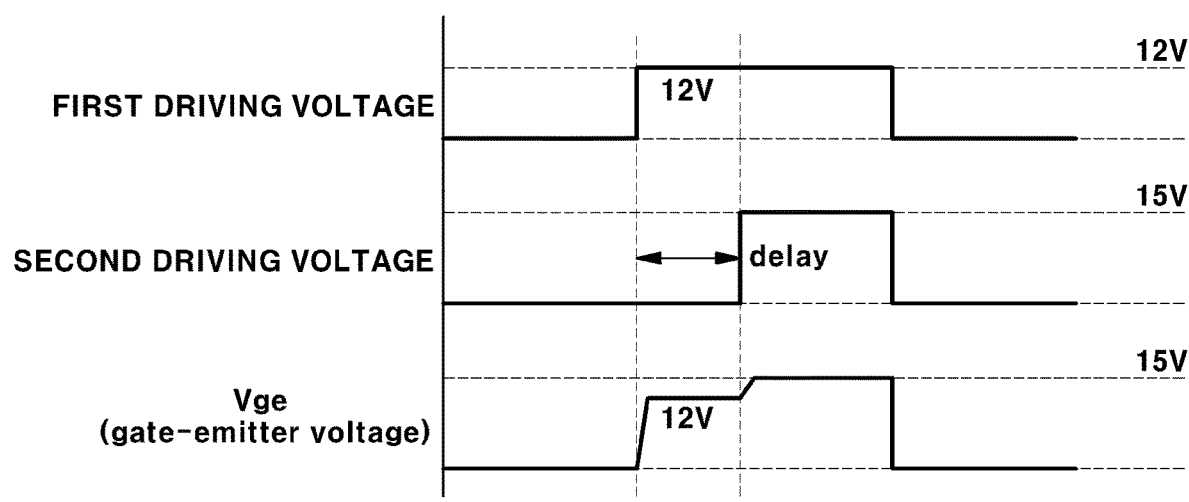
FIG. 5 is a waveform diagram of a 2-level driving voltage in one form of the present disclosure.

In this manner, the driving voltage applied to the gate terminal G may be applied at two levels (see FIG. 5). On the basis of one turn-on of the switching device 311, the first driving voltage is applied to the gate terminal G at a time that the switching device 311 begins to be turned on, and the second driving voltage is then applied to the gate terminal G after the lapse of the delay time from the application of the first driving voltage to the gate terminal G. The second driving voltage is applied to the gate terminal G under the condition that the switching device 311 is turned on. Namely, the second driving voltage higher than the first driving voltage is applied to the gate terminal G under the condition that the first driving voltage is applied to the gate terminal G. In other words, the switching device 311 receives the second driving voltage after being changed to an on state by the first driving voltage. As a result, when the switching device 311 is turned on, the voltage between the gate terminal G and emitter terminal E thereof (gate-emitter voltage Vge) is held at the first driving voltage for the delay time and then rises to the second driving voltage.

Figure 6A:
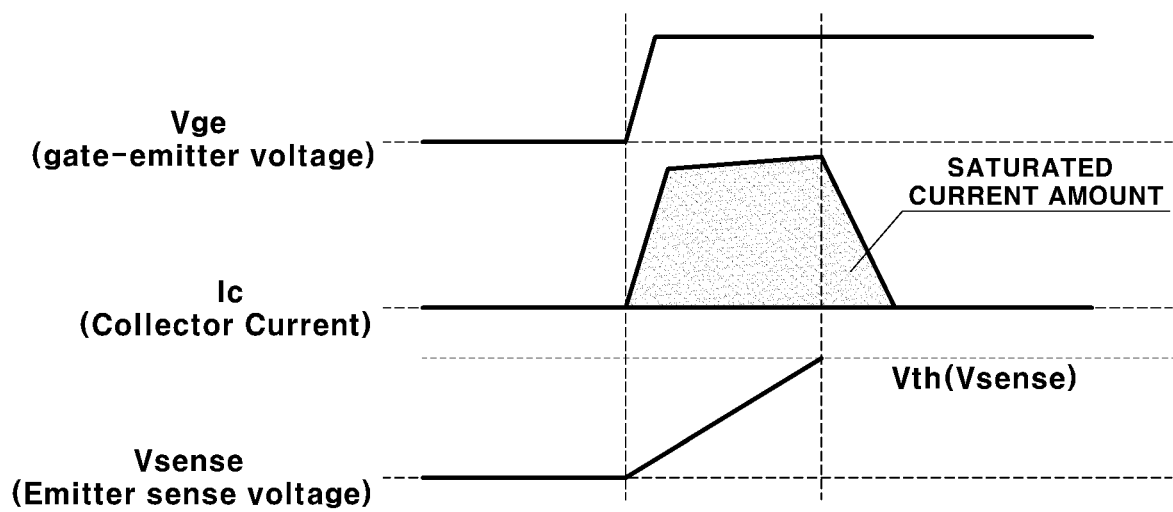
FIG. 6A is a waveform diagram illustrating the amount of current saturated in a switching device when the 2-level driving voltage is not applied in one form of the present disclosure.
Figure 6B:
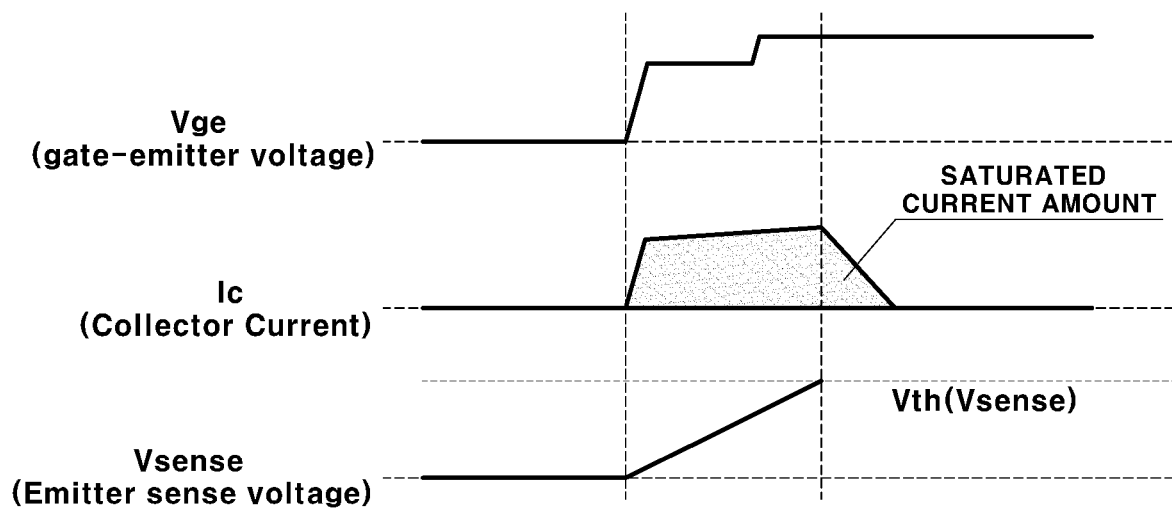
FIG. 6B is a waveform diagram illustrating the amount of current saturated in the switching device when the 2-level driving voltage is applied in one form of the present disclosure.

The switching device 311 is turned on by the first driving voltage and kept on by the second driving voltage. Accordingly, in the beginning of turning-on of the switching device 311, collector current Ic of an amount smaller than that before the second driving voltage is applied to the gate terminal G flows between the collector terminal C and the emitter terminal E, and the amount of current saturated between the collector terminal C and the emitter terminal E (saturated current amount) is relatively small (see FIG. 6A and FIG. 6B). In other words, the saturated current amount of the switching device 311 when the first driving voltage and the second driving voltage are sequentially applied to the gate terminal G to turn on the switching device 311 is smaller than that when only the second driving voltage is applied to the gate terminal G to turn on the switching device 311. The saturated current amount is the amount of current which is saturated between the collector terminal C and the emitter terminal E for a time that the switching device 311 is turned on once and kept on.

Therefore, even though a short-circuit is generated in the power module 31 including the switching device 311, the amount of current saturated between the collector terminal C and emitter terminal E of the switching device 311 is relatively reduced, resulting in a reduction in saturated current energy causing damage to the switching device 311. As a result, it may be possible to prevent the switching device 311 from being damaged even when a short-circuit is generated in the power module 31. In other words, when only the first driving voltage is applied to the gate terminal G, collector current Ic of an amount smaller than that when the second driving voltage is applied to the gate terminal G flows, so that the amount of current saturated between the collector terminal C and the emitter terminal E is relatively small. As the saturated current amount is reduced, the switching device 311 is reduced in saturated current energy, so that it may be prevented from being damaged.

On the other hand, when no short-circuit is generated in the power module 31, the switching device 311 is conducted by the first driving voltage only for the delay time and is kept conducted by the second driving voltage after the lapse of the delay time. Accordingly, the switching device 311 can be normally driven without causing an increase in conduction loss. In addition, in a normal situation in which no short-circuit is generated in the power module 31, collector current Ic of a sufficient amount flows owing to application of the first driving voltage to the gate terminal G, so that the switching device 311 is normally driven.

In addition, the amount of current saturated between the collector terminal C and the emitter terminal E is reduced when a 2-level driving voltage is applied to the gate terminal G (see FIG. 6B) than when a 1-level driving voltage is applied to the gate terminal G (see FIG. 6A), and a voltage Vsense sensed at the emitter terminal E is also thus reduced in rising slope.

The switching device driving control apparatus with the above-described configuration controls the driving voltage to the switching device 311 at two levels. Therefore, when the switching device 311 is turned on, the amount of current saturated in the switching device 311 is reduced, thereby making it possible to, upon generation of a short-circuit in the power module 31, prevent the switching device 311 from being damaged and protect the power module 31.

In addition, because the driving control apparatus controls the driving voltage to the switching device 311 at two levels, it may prevent an increase in conduction loss of the switching device 311 resulting from an increase in voltage drop Vce between the collector terminal C and emitter terminal E of the switching device 311. Furthermore, it may be possible to prevent the vehicle from being degraded in fuel efficiency due to a reduction in efficiency of the inverter 3 resulting from an increase in conduction loss of the switching device 311.

As is apparent from the above description, some forms of the present disclosure provide an apparatus and method for controlling driving of a switching device for a power converter in which a driving voltage to a gate terminal of the switching device is controlled at two levels.

The switching device driving control apparatus drives the switching device with a first driving voltage of a relatively low level in an initial turn-on stage in which the switching device is changed to an on state and begins to be driven, and with a second driving voltage of a relatively high level at a predetermined time after the switching device is turned on. Therefore, when a short-circuit is generated in a power module, the amount of current saturated between a collector terminal and an emitter terminal of the switching device is reduced, thereby making it possible to prevent the switching device from being damaged due to the saturated current. When the power module is normally driven, conduction characteristics of the power converter may be provided similarly to those in a conventional case (namely, in a case where a gate-emitter voltage is not controlled at two levels).

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. An apparatus for controlling a switching device for a power converter where the switching device is turned on by a voltage applied to a gate terminal of the switching device, the apparatus comprising:
   a gate driver configured to:
      apply a first driving voltage and a second driving voltage to the gate
   terminal based on one turn-on of the switching device, wherein the first driving
   voltage and the second driving voltage have different values; and
      turn on the switching device; and
   a controller configured to control the gate driver such that the gate driver applies the second driving voltage to the gate terminal after the first driving voltage is applied to the gate terminal.

2. The apparatus of claim 1, wherein the second driving voltage is greater than the first driving voltage by a predetermined value.

3. The apparatus of claim 1, wherein the gate driver comprises:
   a first switch connected between a first gate power source and the gate terminal and configured to apply the first driving voltage to the gate terminal when the first switch is turned on; and
   a second switch connected between a second gate power source and the gate terminal and configured to apply the second driving voltage to the gate terminal when the second switch is turned on.

4. The apparatus of claim 3, wherein the controller is configured to:
   turn on the first switch; and
   turn on the second switch after a predetermined amount of time when the first switch is turned on.

5. The apparatus of claim 4, wherein, when the switching device is turned on, a voltage applied between the gate terminal and an emitter terminal is maintained at the first driving voltage for the predetermined amount of time and the voltage is increased to the second driving voltage.

6. The apparatus of claim 1, wherein the second driving voltage is input to the gate terminal when the switching device is turned on by the first driving voltage.

7. A method for controlling a switching device for a power converter where the switching device is turned on by a voltage applied to a gate terminal of the switching device, the method comprising:
   applying, by a gate driver, a first driving voltage to the gate terminal to turn on the switching device;
   when the switching device is turned on, applying, by the gate driver, a second driving voltage to the gate terminal, wherein the first driving voltage and the second driving voltage have different values; and
   changing a voltage at the gate terminal to the second driving voltage.

8. The method of claim 7, wherein the second driving voltage is greater than the first driving voltage by a predetermined value.

9. The method of claim 7, wherein the method further comprises:
   applying, by a first switch, the first driving voltage to the gate terminal when the first switch is turned on, wherein the first switch is connected between a first gate power source and the gate terminal; and
   applying, by a second switch, the second driving voltage to the gate terminal when the second switch is turned on, wherein the second switch is connected between a second gate power source and the gate terminal.

10. The method of claim 9, wherein the method further comprises:
    turning on, by a controller, the first switch; and
    turning on, by the controller, the second switch after a predetermined amount of time when the first switch is turned on.

11. The method of claim 10, wherein the method further comprises:
    when the switching device is turned on, maintaining a voltage applied between the gate terminal and an emitter terminal at the first driving voltage for the predetermined amount of time; and
    increasing the voltage to the second driving voltage.

12. The method of claim 7, wherein the method further comprises:
    when the switching device is turned on by the first driving voltage, inputting the second driving voltage to the gate terminal.

* * * * *